United States Patent

[11] 3,573,632

[72] Inventor Hans Kuhn
Pforzheim, Germany
[21] Appl. No. 681,621
[22] Filed Nov. 9, 1967
[45] Patented Apr. 6, 1971
[73] Assignee International Standard Electric Corporation
New York, N.Y.
[32] Priority Nov. 25, 1966
[33] Germany
[31] ST26212

[54] COMBINED PARAMETRIC AMPLIFIER AND MIXER ARRANGEMENT
7 Claims, 1 Drawing Fig.

[52] U.S. Cl. .......... 325/445, 307/88.3, 330/4.5
[51] Int. Cl. .......... H04b 1/26
[50] Field of Search .......... 325/442, 445; 325/443—446, 448, 485, 491; 307/88.3; 330/4.5; 330/4.5—4.9, 10, 116, 117

[56] References Cited
UNITED STATES PATENTS

| | | | |
|---|---|---|---|
| 3,114,881 | 12/1963 | Venohara .......... | 325/442 |
| 3,341,783 | 9/1967 | Roulston .......... | 325/445 |
| 3,320,432 | 5/1967 | LaRosa .......... | 325/432 |
| 3,484,698 | 12/1969 | Ruppli .......... | 307/88.3 |

*Primary Examiner*—Robert L. Griffin
*Assistant Examiner*—Albert J. Mayer
*Attorneys*—C. Cornell Remsen, Jr., Rayson P. Morris, Percy P. Lantzy, Philip M. Bolton and Isidore Togut

ABSTRACT: An arrangement comprising a parametric amplifier, a mixer, an oscillator coupled to the mixer, a frequency doubler coupled to the oscillator to provide a pump frequency for the amplifier, and a source of input signals coupled to the amplifier wherein the idler frequency and amplified input signals are combined with the oscillator signals in the mixer to produce two sideband signals of the same frequency that are combined resulting in a single sideband signal output of the mixer having increased amplitude.

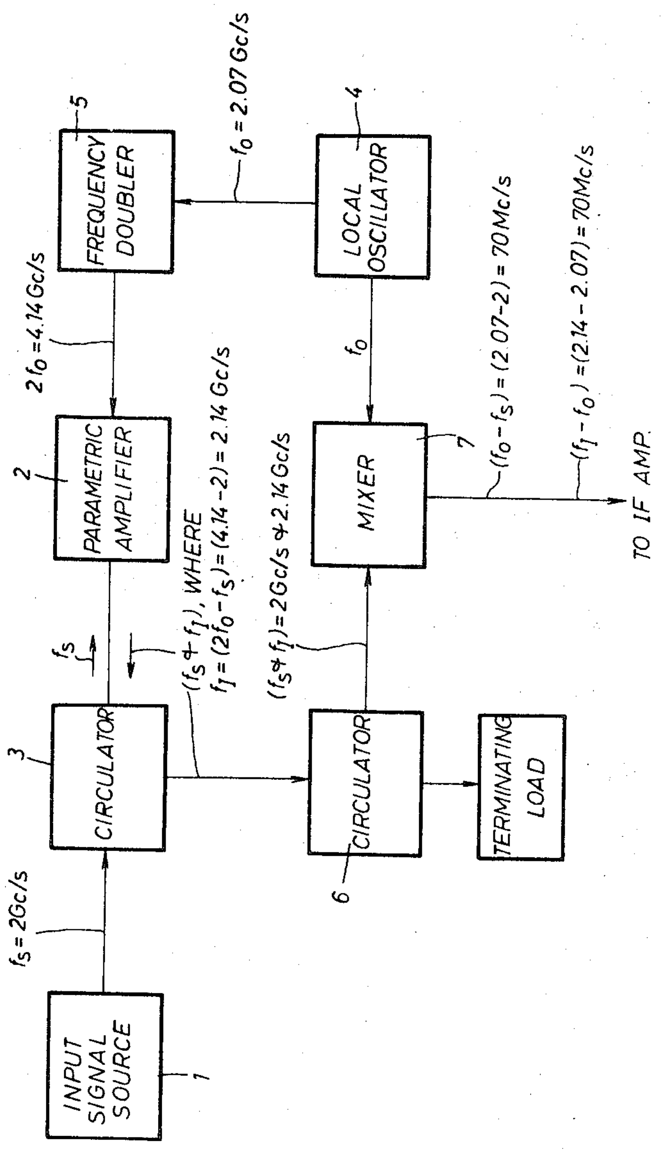
INVENTOR
HANS KUHN
BY Alfred C. Hill
AGENT

COMBINED PARAMETRIC AMPLIFIER AND MIXER ARRANGEMENT

BACKGROUND OF THE INVENTION

This invention relates to a parametric radiofrequency amplifier and more particularly to such an amplifier having a negative resistance characteristic combined with a mixer stage.

The parametric amplification is obtained, as known, by the so-called "pumping" of a nonlinear reactance, preferably a varactor diode. The pumping frequency is in general substantially above the signal frequency. The pumping frequency is at least twice as high as the signal frequency.

In principle there exists two types of parametric amplifiers. The first type is the so-called up-converter in which the signal to be amplified is shifted upward in its frequency in the parametric amplifier. In this type of parametric amplifier the amplification is in direct proportion to the frequency ratio of input and output signal. The second type is the so-called negative resistance parametric amplifier. In this type of parametric amplifier the negative resistance furnishes the positive, additional signal energy for the amplification. In the negative resistance parametric amplifier there exists, besides the signal frequency and the pumping frequency, a difference frequency (idler frequency). The sum of the signal frequency and difference, or idler, frequency equals the pumping frequency. Furthermore it is conventional to combine both types of parametric amplification.

If the signal frequency coincides with the idler frequency it represents a degenerated parametric amplifier in which the pumping frequency is exactly twice as high as the signal frequency. For this case the amplification can be represented particularly vivid. It is only necessary to consider a capacitor, the capacity of which is varied at twice the signal frequency. Thus, the capacitor is charged by the input signal when the capacitor has a high capacity and discharged by the signal when being in the low capacity condition. This clear representation may be used for nondegenerated parametric amplifiers. Thus, the input signal and the idler signal together must be considered as sidebands of a signal being 200 percent amplitude-modulated with the carrier frequency being equal to one-half the pump frequency $f_p$ and the modulation frequency being equal to one-half the pump frequency $f_p$ minus the input signal frequency $f_s$.

SUMMARY OF THE INVENTION

An object of the present invention is to provide a combination of a parametric amplifier having both an up-converter and negative resistance characteristics and a mixer to provide a single sideband signal having an increased gain.

Another object of the present invention is to provide the above-mentioned combination which enables eliminating the usual sideband filter at the output of the mixer.

A feature of the present invention is the provision of a combined parametric amplifier and mixer arrangement to generate a single sideband signal having increased amplitude comprising a source of input signal having a first given frequency; a parametric amplifier; first means to generate a local oscillator signal having a second given frequency different than the first given frequency; a mixer coupled to the first means; second means coupled between the first means and parametric amplifier to provide a pump signal having a third given frequency different than the first and second given frequencies for the parametric amplifier; and third means coupled between the source, the parametric amplifier and the mixer to enable the mixer to combine the difference frequency of the local oscillator signal and the input signal with the difference frequency of the local oscillator signal and the lower sideband of the input signal and the pump signal to generate the single sideband signal.

BRIEF DESCRIPTION OF THE DRAWING

The above-mentioned and other features and objects of this invention will become more apparent by reference to the following description taken in conjunction with the drawing, the single FIG. of which is a block diagram of the combined parametric amplifier and mixer arrangement in accordance with the principles of this invention.

DESCRIPTION OF THE PREFERRED EMBODIMENT

According to the FIG. the arrangement of the present invention comprises source 1 of input signal having a frequency $f_s$, for example, 2 gc/s (gigacycles per second), parametric amplifier 2 having both a negative I=and up-converter characteristic to which the input signal is coupled by means of circulator 3, and a source of pump signal having a frequency $2f_o$, for example, 4.14 gc/s, including local oscillator 4 generating a signal having a frequency $f_o$, for example, 2.07 gc/s, and frequency doubler 5. Parametric amplifier 2 in response to the input signal and the pump signal provides an amplified version of the input signal and an idler signal having approximately the same amplitude as the amplified input signal and a frequency $f_I=2f_o-f_s=2.14$ Gc/s. The amplified input signal having a frequency $f_s$ and the idler signal having a frequency $f_I$ are coupled by circulators 3 and 6 to mixer 7 to which is also coupled the oscillator signal from oscillator 4 having a frequency $f_o$. In accordance with the example employed herein for purposes of explanation, mixer 7 mixes the input signal and the oscillator signal to produce a first sideband signal having a frequency of 70 mc/s (megacycles per second)=$(f_o-f_s)$=(2.07 gc/s−2 gc/s). Mixer 7 also mixes the idler signal and the oscillator signal to produce a second sideband signal having a frequency of 70 mc/s=$(a8I-f_0)$=(2.14 gc/s−2.07 gc/s). Both these intermediate-frequency signals have the same signal contents and can be added if they are equal in phase to produce a single sideband signal output for mixer 6 having a gain increase of 3 db (decibels).

In order to show the technical progress obtained with the arrangement according to the invention, it is pointed out that for the hitherto conventional parametric amplifiers an arbitrary, in most cases very high pumping frequency is used. In the arrangement according to the invention the doubled receiver local oscillator frequency serves as pumping frequency for the parametric amplifier, so that during the mixing the lower sideband of one signal is equal in frequency with the upper sideband of the other signal and these two signals can be added, if they are equal in phase. As already mentioned this results in a 3 dB gain compared to the arrangements hitherto known. Moreover, the filter to filter out the sideband desired can be omitted.

While I have described above the principles of my invention in connection with specific apparatus, it si to be understood that this description is made only by way of example and not as a limitation to the scope of my invention as set forth in the objects thereof and in the accompanying claims.

I claim:

1. A combined parametric amplifier and mixer arrangement to generate a single sideband signal having increased amplitude comprising:
   - a source of input signal having a first given frequency;
   - a parametric amplifier having a pump signal input and a combined input-output;
   - first means to generate a local oscillator signal having a second given frequency different than said first frequency;
   - a mixer having two inputs and an output, one of said inputs being coupled to the output of said first means;
   - second means coupled between said output of said first means and said pump signal input of said parametric amplifier to provide a pump signal having a third given frequency different than said first and second given frequency for said parametric amplifier; and third means coupled between the output of said source, said combined input-output of said parametric amplifier and the other of said inputs of said mixer;

said mixer responding to said input signal, said local oscillator signal and the lower sideband of said input signal and said pump signal to combine the difference frequency of said local oscillator signal and said input signal with the difference frequency of said local oscillator signal and the lower sideband of said input signal and said pump signal to generate said single sideband signal at the output of said mixer.

2. An arrangement according to claim 1, wherein, said third given frequency is twice said second given frequency.

3. An arrangement according to claim 1, wherein, said second means includes a frequency doubler.

4. An arrangement according to claim 1, wherein, said third means includes;

first circulator means coupled between said source and said parametric amplifier to supply said input signal to said parametric amplifier and to extract said input signal and said lower sideband of said input signal and said pump signal from said parametric amplifier; and second circulator means coupled between said first circulator means and said mixer to supply said input signal and said lower sideband of said input signal and said pump signal to said mixer.

5. An arrangement according to claim 1, wherein:

said second means includes a frequency doubler; and said third means includes;

first circulator means coupled between said source and said parametric amplifier to supply said input signal to said parametric amplifier and to extract said input signal and said lower sideband of said input signal and said pump signal from said parametric amplifier; and second circulator means coupled between said first circulator means and said mixer to supply said input signal and said lower sideband of said input signal and said pump signal to said mixer.

6. An arrangement according to claim 5, wherein, said parametric amplifier has a negative resistance and up-converter characteristic.

7. An arrangement according to claim 1, wherein, said parametric amplifier has a negative resistance and up-converter characteristic.